US010742171B2

(12) United States Patent
Roiz et al.

(10) Patent No.: US 10,742,171 B2
(45) Date of Patent: Aug. 11, 2020

(54) NESTED MICROSTRIP SYSTEM AND METHOD

(71) Applicant: NXP USA, Inc., Austin, TX (US)

(72) Inventors: Arturo Roiz, Chandler, AZ (US); Justin Nelson Annes, Chandler, AZ (US); Michelle Nicole Corn, Chandler, AZ (US)

(73) Assignee: NXP USA, Inc., Austin, TX (US)

( * ) Notice: Subject to any disclaimer, the term of this patent is extended or adjusted under 35 U.S.C. 154(b) by 0 days.

(21) Appl. No.: 15/824,660

(22) Filed: Nov. 28, 2017

(65) Prior Publication Data

US 2019/0165737 A1    May 30, 2019

(51) Int. Cl.
*H03F 1/02* (2006.01)
*H03F 3/213* (2006.01)
(Continued)

(52) U.S. Cl.
CPC .......... *H03F 1/0288* (2013.01); *H01P 3/081* (2013.01); *H03F 1/56* (2013.01); *H03F 3/195* (2013.01); *H03F 3/213* (2013.01); *H03F 3/601* (2013.01); *H05K 1/0243* (2013.01); *H05K 1/181* (2013.01); *H03F 2200/222* (2013.01);
(Continued)

(58) Field of Classification Search
CPC .......... H03F 1/0288; H03F 1/56; H03F 3/195; H03F 3/213; H03F 3/601; H03F 2200/222; H03F 2200/387; H03F 2200/451; H01P 3/08; H01P 3/081; H01P 7/08;
(Continued)

(56) References Cited

U.S. PATENT DOCUMENTS 4,616,205 A * 10/1986 Praught ............... H01F 27/2866
336/195
6,734,728 B1   5/2004 Leighton et al.
(Continued)

FOREIGN PATENT DOCUMENTS

WO        WO9742678 A  * 11/1997  ............. H01P 5/186

OTHER PUBLICATIONS

Gu et al. "Dual-band GaN power amplifiers with novel DC biasing networks incorporating offset double-sided parallel strip line"; IET Journal, IET Microw, Antennas Propag., 2016, vol. 10, Iss. 3, pp. 271-275; ISSN 1751-8725, published Oct. 2015; www.ietdl.org.

*Primary Examiner* — Robert J Pascal
*Assistant Examiner* — Kimberly E Glenn

(57) ABSTRACT

Nested microstrip systems and methods, and systems and methods encompassing same, are disclosed herein. In one example, a nested microstrip system includes a printed circuit board (PCB) having first and second layer levels, where first and second conductive traces are positioned at the second layer level. The first conductive trace is configured to include an orifice, and to extend between first and second locations along a first path, and the second conductive trace is positioned within the orifice. A non-conductive gap portion of the orifice exists between the first and second conductive traces so that the second conductive trace is electrically isolated from the first conductive trace. One or more first electromagnetic signals can be propagated along a first part of the first conductive trace, and one or more second electromagnetic signals can be propagated along at least a second part of the second conductive trace.

31 Claims, 5 Drawing Sheets

(51) Int. Cl.
| | |
|---|---|
| *H03F 3/195* | (2006.01) |
| *H03F 3/60* | (2006.01) |
| *H01P 3/08* | (2006.01) |
| *H05K 1/18* | (2006.01) |
| *H05K 1/02* | (2006.01) |
| *H03F 1/56* | (2006.01) |

(52) U.S. Cl.
CPC .. *H03F 2200/387* (2013.01); *H03F 2200/451* (2013.01); *H05K 2201/10166* (2013.01)

(58) Field of Classification Search
CPC .... H01P 7/0812; H05K 1/0243; H05K 1/181; H05K 2201/10166
USPC ......................................................... 333/136
See application file for complete search history.

(56) References Cited

U.S. PATENT DOCUMENTS

| | | |
|---|---|---|
| 7,158,386 B2 | 1/2007 | Shih et al. |
| 8,299,856 B2 | 10/2012 | Blair |
| 2007/0188259 A1 | 8/2007 | Jones et al. |
| 2017/0117856 A1 | 4/2017 | Zhu et al. |

\* cited by examiner

NESTED MICROSTRIP SYSTEM AND METHOD

CROSS-REFERENCE TO RELATED APPLICATIONS

STATEMENT REGARDING FEDERALLY SPONSORED RESEARCH OR DEVELOPMENT

FIELD OF THE DISCLOSURE

The present disclosure relates to electrical circuits and systems including electrical circuits and systems that include or involve operation by way of one or more resonators and, more particularly, to such electrical circuits and systems that are implemented at least in part upon printed circuit boards (PCBs) including, for example, power amplifiers such as Doherty power amplifiers.

BACKGROUND OF THE DISCLOSURE

Conventional high power amplifiers such as those utilized for telecommunications purposes, including for example Doherty power amplifiers, often have bias line implementations so as to achieve increased baseband equivalence resonance. Such implementations can for example involve the use of dual symmetrical bias lines (or feeds) that achieve increased baseband equivalent resonance by a factor of the square root of two. Such an improvement can arise from the parallel combination of both bias line equivalent circuits (assuming both lines are symmetrical and have the same dimensions). This in turn will reduce (by half) the equivalent inductance (e.g., in nanoHenries) from the bias lines presented at the package reference plane.

Further for example, FIG. 1 shows a circuit diagram 100 intended to illustrate an example high power amplifier (or package) 102 coupled to first and second bias lines 104 and 106, respectively. As shown, the high power amplifier 102 includes a power transistor 108 that in the present example is a LDMOS (Laterally Diffused Metal Oxide Semiconductor) transistor having a drain that is coupled to each of a first inductor 110 and a second inductor 112. The second inductor 112 is coupled in series between the drain of the power transistor 108 and a capacitor 114, and the capacitor 114 is coupled in series between the second inductor 112 and an additional port 116, which can be ground. The first inductor 110 is coupled between the drain of the power transistor 108 and an output port 118 of the high power amplifier 102. As for the first and second bias lines 104, 106, each of those bias lines includes a respective transmission line 120 and a respective set of first, second, and third capacitors 122, 124, and 126. The respective transmission line 120 of each of the bias lines 104, 106 is coupled between the output port 118 of the high power amplifier 102 and each of the three capacitors 122, 124, and 126 of the respective bias line. All three of the respective capacitors 122, 124, and 126 of each respective bias line 104, 106 are coupled in parallel with one another between the respective transmission line 120 and another port, which can be the additional port 116 (and can be ground). Further as illustrated, each of the bias lines 104, 106 can be represented by a small signal equivalent circuit 128 including an inductor 129 and a capacitor 130 coupled in series with one another (e.g., between two ends of the equivalent circuit that are each tied to the additional port 116 and can be grounded).

Given such an arrangement, it should be appreciated that a first resonant frequency $f_{R1}$ of the first bias line 104 and a second resonant frequency $f_{R2}$ of the second bias line 106 can be represented, respectively, by the following Equation (1) and Equation (2):

$$f_{R1} = 1/(2\pi(L_{tot}C_{tot})^{1/2}) \quad (1)$$

$$f_{R2} = 1/(2\pi(L_{tot}C_{tot})^{1/2}) \quad (2)$$

Given this to be the case, the overall increase in the baseband equivalent resonance that arises from the combination of the first and second bias lines 104, 106 can be determined as the first resonant frequency $f_{R1}$ divided by the second resonant frequency $f_{R2}$, which as shown by the following Equation (3) has a value of the square root of two.

$$\frac{f_{R1} = \dfrac{1}{2\pi\sqrt{L_{tot}C_{tot}}}}{f_{R2} = \dfrac{1}{2\pi\sqrt{\dfrac{L_{tot}}{2}C_{tot}}}} = \frac{f_{R1}}{f_{R2}} = \sqrt{2} \quad (3)$$

Although the above-mentioned approach can thus theoretically result in an improvement in the baseband equivalent resonance by a factor of the square root of two, conventional designs employing such an approach have several disadvantages. A first disadvantage associated with conventional designs such as that of FIG. 1 is that implementation of the first and second bias lines (e.g., the bias lines 104, 106) requires an increased printed circuit board (PCB) footprint for proper design implementation.

Additionally, conventional designs also suffer from a second disadvantage in that the equivalent baseband resonance achieved by this type of approach typically is in the range of approximately 160 MHz (Megahertz), which is not sufficient to satisfy current multiband or new 5G LTE (5th generation Long Term Evolution) wideband standards. Indeed, there is an increasing need for base stations—and underlying power amplifiers—that can achieve signal bandwidth (or maximum bandwidth) on the order of 200 to 400 MHz (or even beyond), with accompanying higher power levels and current levels, as well as an increasing desire to implement radios that support multiple channels. The aforementioned conventional designs are inadequate for addressing such performance goals. Relatedly, the traditional high value capacitor (HiC) type of baseband termination generally cannot be effectively used in conjunction with shunt-L pre-match due to the impacts of the second harmonic.

For at least these reasons, therefore, it would be advantageous if one or more improved circuits, systems and methods for achieving enhanced baseband resonance, and/or one or more other advantages, could be developed.

DETAILED DESCRIPTION

Figure 1:
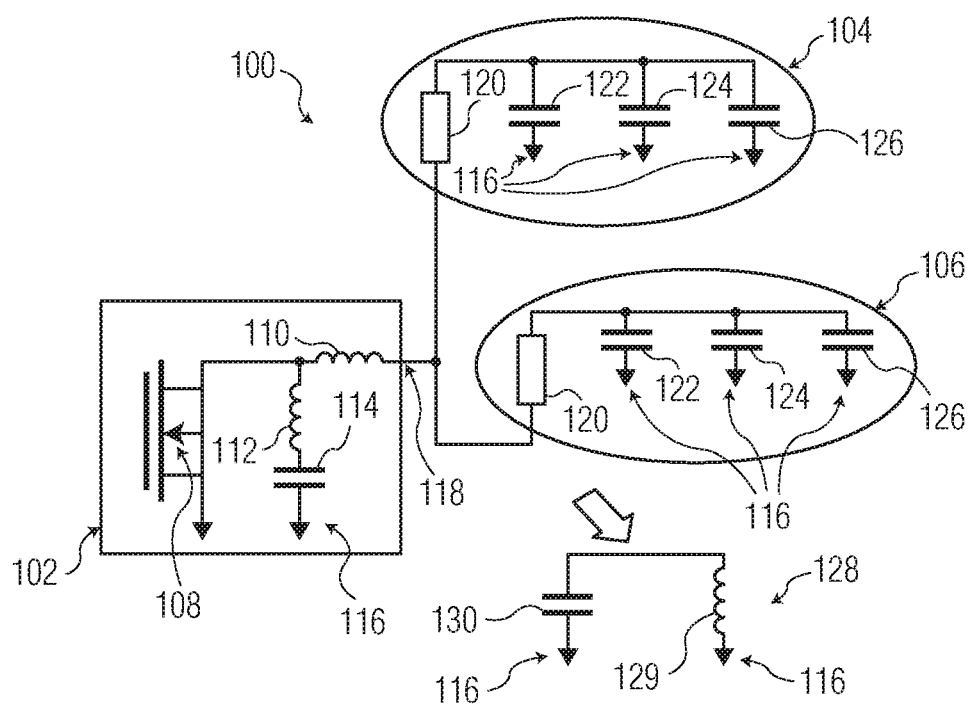
FIG. 1 is a schematic diagram illustrating in general form a circuit including a high power amplifier and a pair of bias lines.

The present disclosure encompasses a variety of embodiments of circuits and systems in which one microstrip transmission line or trace is positioned or nested within another microstrip transmission line or trace. In at least some such embodiments, low frequency baseband terminations are positioned or nested within high frequency impedance matching transformers (or possibly vice-versa). This can be accomplished by implementing inline/nested matching networks where two different source signals—for example, a RF signal having a high frequency ($f_1$) and a baseband signal having a low frequency ($f_2$, where $f_1 \gg f_2$)—can be independently made to flow isolated from each other and embedded using the same RF signal path. Additionally, in at least some such embodiments, the baseband terminations and impedance matching transformers are both formed by microstrip transmission lines or traces formed on a printed circuit board (PCB).

Through the implementation or use of such circuits or systems, any one or more of a variety of advantages or performance characteristics may be achieved depending upon the embodiment. To begin, at least some embodiments encompassed herein may achieve enhanced baseband resonance performance. For example, in at least some embodiments encompassed herein, the baseband resonance and signal bandwidth of a power amplifier may be increased by nesting low frequency baseband terminations into the high frequency impedance matching transformers on the same plane. By nesting low frequency networks within high frequency matching structures, the PCB footprint may be maintained the same or reduced for the circuit design by comparison with the PCB footprint(s) of conventional designs. In at least some cases, this may allow for multiple baseband terminations without increasing the overall PCB footprint. This is in contrast to conventional arrangements in which several baseband terminations might be added to a traditional matching circuit in a perpendicular (non-nested) manner, which would consume an undesirable amount of PCB space (if it was possible at all) in various circuit implementations such as in the case of single package Doherty power amplifiers.

Thus, at least some embodiments encompassed herein may provide an approach involving using complementary multiple baseband terminations to mitigate the effects of baseband resonance while optimizing the footprint space needed for its implementation. Such arrangements may offer the possibility of using unmatched, high terminal impedance technologies (for example, 50V LDMOS transistors and GaN (gallium nitride) transistors) to meet the multiband signal requirements of today and future 5G LTE wideband standards. Also at least some such arrangements may allow for increased baseband resonance with higher Ropt devices. In at least some embodiments encompassed herein, an equivalent bias line feed inductance (baseband) may be reduced by a factor (multiple) of four. Additionally, at least some embodiments encompassed herein may eliminate the use of/need for a high value capacitor (HiC) internal terminations for some applications. Further, at least some embodiments encompassed herein may provide an ability to tune harmonic impedances presented to a device within the same PCB structure (or using the same baseband structure). In at least some such embodiments, an additional high frequency RF cap may be bridged between low and high frequency structures to allow for tuning of a second harmonic independent of the baseband circuit.

Figure 2:
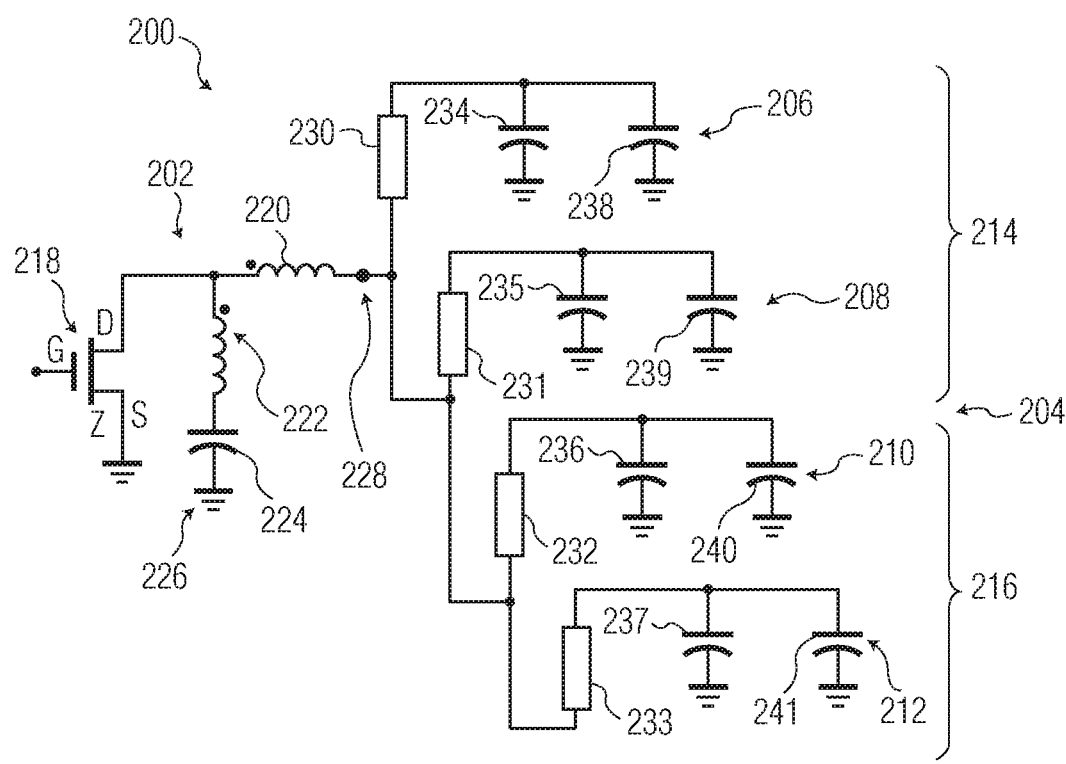
FIG. 2 is a schematic diagram illustrating in general form a circuit (as a small signal equivalent circuit) including a high power amplifier and two pairs of nested bias lines, in accordance with one example embodiment encompassed herein.

Referring to FIG. 2, a schematic diagram is provided to illustrate in general form a circuit 200 that includes a high power amplifier 202 and a set of bias lines 204, which can be transmission lines as can respectively be provided by way of respective traces on a printed circuit board (PCB). The set of bias lines 204 particularly is intended to represent an arrangement of bias lines in which there first, second, third, and fourth bias lines 206, 208, 210, and 212, respectively. Further, the set of bias lines 204 is intended to represent an arrangement of bias lines in which, more specifically, the second bias line 208 is nested within the first bias line 206, and the fourth bias line 212 is nested within the third bias line 210. That is, the set of bias lines 204 particularly includes a first nested bias line arrangement 214 that includes the first and second bias lines 206 and 208, and also a second nested bias line arrangement 216 that includes the third and fourth bias lines 210 and 212.

Additionally as illustrated by FIG. 2, in the present example embodiment, the high power amplifier 202 includes a power transistor 218 that in the present example is a LDMOS (Laterally Diffused Metal Oxide Semiconductor) transistor or other MOSFET (MOS Field Effect Transistor) having a drain that is coupled to each of a first inductor 220 and a second inductor 222. The second inductor 222 is coupled in series between the drain of the power transistor 218 and a capacitor 224, and the capacitor 224 is coupled in series between the second inductor 222 and an additional port 226, which can be ground. The first inductor 220 is coupled between the drain of the power transistor 218 and an output port 228 of the high power amplifier 202. As for the first, second, third, and fourth bias lines 206, 208, 210, and 212, each of those bias lines respectively includes a respective transmission line 230, 231, 232, and 233, a respective first capacitor 234, 235, 236, and 237, and a respective second capacitor 238, 239, 240, and 241. In the present embodiment, each of the capacitors 234, 235, 236, 237, 238, 239, 240, and 241 shown in FIG. 2 is intended to be representative of a discrete capacitor rather than a distributed capacitance, although in other embodiments distributed capacitance(s) can additionally (or instead) be present.

More particularly as shown, the transmission line 230 of the bias line 206 is coupled between the output port 228 (of the high power amplifier 202) and each of the capacitors 234 and 238 of the bias line 206, the transmission line 231 of the bias line 208 is coupled between the output port 228 and each of the capacitors 235 and 239 of the bias line 208, the transmission line 232 of the bias line 210 is coupled between the output port 228 and each of the capacitors 236 and 240 of the bias line 210, and the transmission line 233 of the bias line 212 is coupled between the output port 228 and each of the capacitors 237 and 241 of the bias line 212. Further, both of the first and second capacitors 234 and 238, 235 and 239, 236 and 240, and 237 and 241 of each respective bias line 206, 208, 210, and 212 are coupled in parallel with one another between the respective transmission line 230, 231, 232, and 233 and another respective port, which in the present embodiment as an example can be the additional port 226 (and can be ground). It should be appreciated that each of the bias lines 206, 208, 210, and 212 can be represented by a small signal equivalent circuit that can be identical to that of FIG. 1 except that the ends of the equivalent circuit would both be tied to the additional port 226.

Additionally, it should further be appreciated that FIG. 2 is intended to be representative of a variety of embodiments of bias lines having a variety of different components and characteristics. In some embodiments encompassed herein, two or more of the bias lines 206, 208, 210, and 212 can be identical or substantially similar to one another and have components that are identical or substantially similar to one another. Nevertheless, in the present embodiment and other embodiments encompassed herein, the different ones of the bias lines 206, 208, 210, and 212 are different from one another and have one or more components that differ among the different bias lines. Further for example, although in some embodiments two or more (or all) of the transmission lines 230, 231, 232, and 233 can be identical or substantially similar, in the present embodiment (and other embodiments encompassed herein) the respective transmission lines 230, 231, 232, and 233 respectively have different characteristics relative to one another (including, for example, different physical lengths). Also for example, although in some embodiments two or more (or all) of the first capacitors 234, 235, 236, and 237 can be identical or substantially similar, in the present embodiment (and other embodiments encompassed herein) the respective first capacitors 234, 235, 236, and 237 respectively have different capacitance values relative to one another. Further for example, although in some embodiments two or more (or all) of the second capacitors 238, 239, 240, and 241 can be identical or substantially similar, in the present embodiment (and other embodiments encompassed herein) the respective second capacitors 238, 239, 240, and 241 respectively have different capacitance values.

Also, although in some embodiments the respective first and second capacitors of each of the bias lines 206, 208, 210, and 212 can have identical or substantially similar capacitance values (that is, for example, the capacitance of the first capacitor 234 can be identical or substantially similar to the capacitance of the second capacitor 238 and, also for example, the capacitance of the first capacitor 235 can be identical or substantially similar to the capacitance of the second capacitor 239), this need not be the case. Indeed, in one example embodiment corresponding to FIG. 2, it is envisioned that each of the respective first capacitors 234, 235, 236, and 237 of the respective bias lines 206, 208, 210, and 212 will have a respective capacitance value in the range of 100 picoFarads to 1 microFarad and that each of the respective second capacitors 238, 239, 240, and 241 of the respective bias lines 206, 208, 210, and 212 will have a respective capacitance value in the range of 1 microFarad to 20 microFarads, such that the respective capacitances of each of the second capacitors will be greater than or equal to the respective capacitances of each of the first capacitors. Notwithstanding this example, the present disclosure is intended to encompass numerous other embodiments in which any of these capacitors have other capacitance values.

Also, as will be discussed further below, for example, in embodiments in which one bias line (e.g., any of the bias lines 206, 208, 210, or 212) is nested within another bias line (or other line or trace) that extends about or around that one (nested) bias line, the components and electrical characteristics of the nested bias line can be and typically are different from those of that other bias line.

The circuit 200 of FIG. 2 is intended to illustrate one example embodiment encompassed herein in which a set of resonators is provided on the same impedance node at the package reference plane such that the overall total equivalent series trace inductance at baseband frequency is reduced. In one example version of the circuit 200, according to which each of the four bias lines 206, 208, 210, and 212 grouped together are of equal length, the total effective baseband resonance (Fr_tot) will be improved by factor of approximately two. This can be verified by the equations (4), (5), (6), and (7) below:

$$Fr1 = \frac{1}{2\pi\sqrt{L_{line1} * Cds}} \quad (4)$$

$$Fr_n = \frac{1}{2\pi\sqrt{L_{line_n} * Cds}}; \quad (5)$$

$$L_{line\_n} = \frac{L_{line1}}{N} \quad (6)$$

$$Fr\_tot = \frac{Fr1}{Fr\_n} = \sqrt{2} * \sqrt{2} = 2 \quad (7)$$

In regard to equations (4), (5), (6), and (7), it should be appreciated that the variable Fr1 represents the resonant frequency associated with a first of the bias lines (e.g., the bias line 206), and that the variable $Fr_n$ (or Fr_n) represents the resonant frequency associated with any of the first, second, third, and fourth bias lines 206, 208, 210, and 212, respectively, where the variable n represents the number of the bias line. Also, the variable $L_{line1}$ represents the inductance of the first transmission line (e.g., the transmission line 230 of the first bias line 206), the variable $L_{line_n}$ (or $L_{line\_n}$) represents the inductance of the any of the bias lines of any of the first, second, third, and fourth bias lines (e.g., the bias lines 206, 208, 210, 212), where the variable n again represents the number of the bias line. Thus, for example, in the case where n=1 (because the bias line of interest is the first bias line 206), equation (5) devolves equation (4) but, further for example, in the cases where n=2, 3, or 4, respectively (because the bias line of interest is the second bias line 208, third bias line 210, or fourth bias line 212, respectively), the variable $Fr_n$ becomes $Fr_2$, $Fr_3$, or $Fr_4$, respectively, and the variable $L_{line_n}$ becomes $L_{line_2}$, $L_{line_3}$, or $L_{line_4}$, respectively. Further, the variable N represents the total number of bias lines (e.g., in the example embodiment of FIG. 2, N=4), and the variable Cds represents the capacitance associated with each of the bias lines 206, 208, 210, and 212 (e.g., the parallel combination of the capacitors 234 and 236 of each of the bias lines). Finally, as already noted above, the variable Fr_tot represents the overall resonant frequency of the parallel combination of all of the bias lines 206, 208, 210, and 212.

Figure 3:
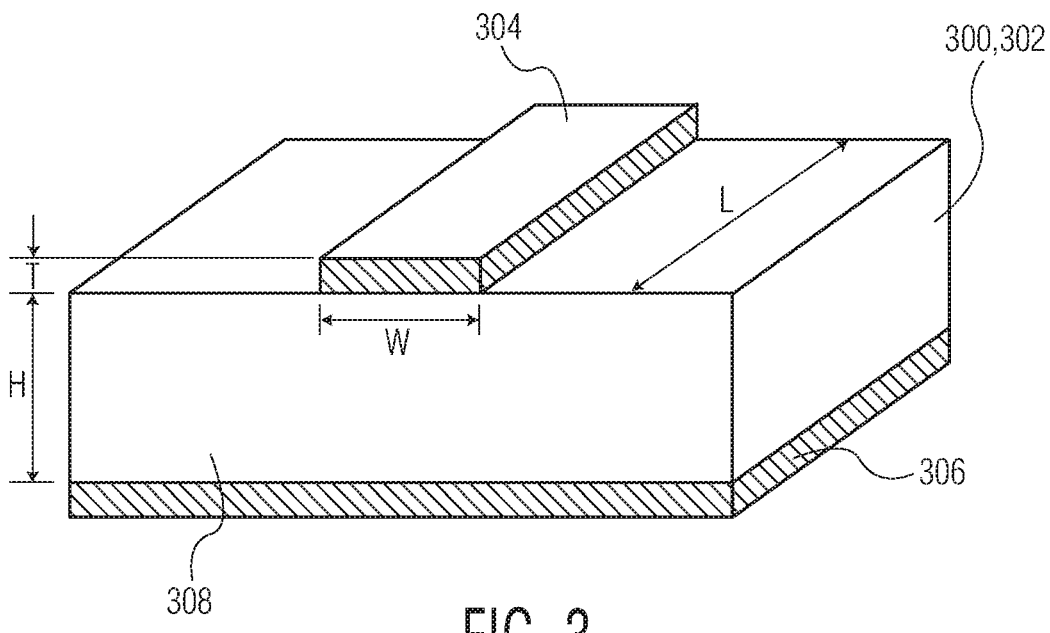
FIG. 3 is a schematic perspective, partly-cross-sectional view of a microstrip transmission line that can be formed upon a printed circuit board (PCB), and that can serve as a bias line in accordance with at least some embodiments encompassed herein.

As mentioned above, the circuit 200 is particularly intended to be representative of PCB embodiments in which each of the bias lines 206, 208, 210 and 212 is formed by way of a microstrip transmission line. FIG. 3 is provided to illustrate schematically a cross-sectional, perspective view of a portion of a PCB 300 particularly having an example microstrip transmission line 302 formed thereon. As shown, the microstrip transmission line 302 particularly is formed by providing a conductive trace 304 (e.g., copper) that extends parallel to a conductive layer (e.g., a ground plane) 306 and that is separated from the conductive layer 306 along the length of the conductive trace by a gap 308 in which is provided a dielectric substrate material.

In view of FIG. 3, it should be appreciated that in the present embodiment calculation of the effective equivalent bias line inductance per bias line (that is, $L_{line_n}$ for the various different values of n) can be performed in accordance with conventional microstrip theory according to the following equation (8):

$$L_{TOT}(=L_{line_n})=0.00508[\ln(2L/(W+H))+0.5+0.2235(W+H)/L] \tag{8}$$

In equation (8) it should be appreciated that variables W and L respectively represent the width and length of the conductive trace 304 as measured within a plane that is parallel to the conductive layer 306, and along dimensions that are respectively perpendicular and parallel to the direction of signal propagation down the transmission line. Further, the variable H represents the distance between the conductive trace 304 and the conductive layer 306, measured perpendicular to the conductive layer 306 (or the plane of the conductive trace 304 that is parallel to that conductive layer), and thus represents the thickness of the gap 308. Although not found in equation (8), it will also be appreciated that the conductive trace 304 itself has a thickness T also when measured perpendicular to the conductive layer 306 (or perpendicular to the plane of the conductive trace 304 that is parallel to that conductive layer).

Figure 4:
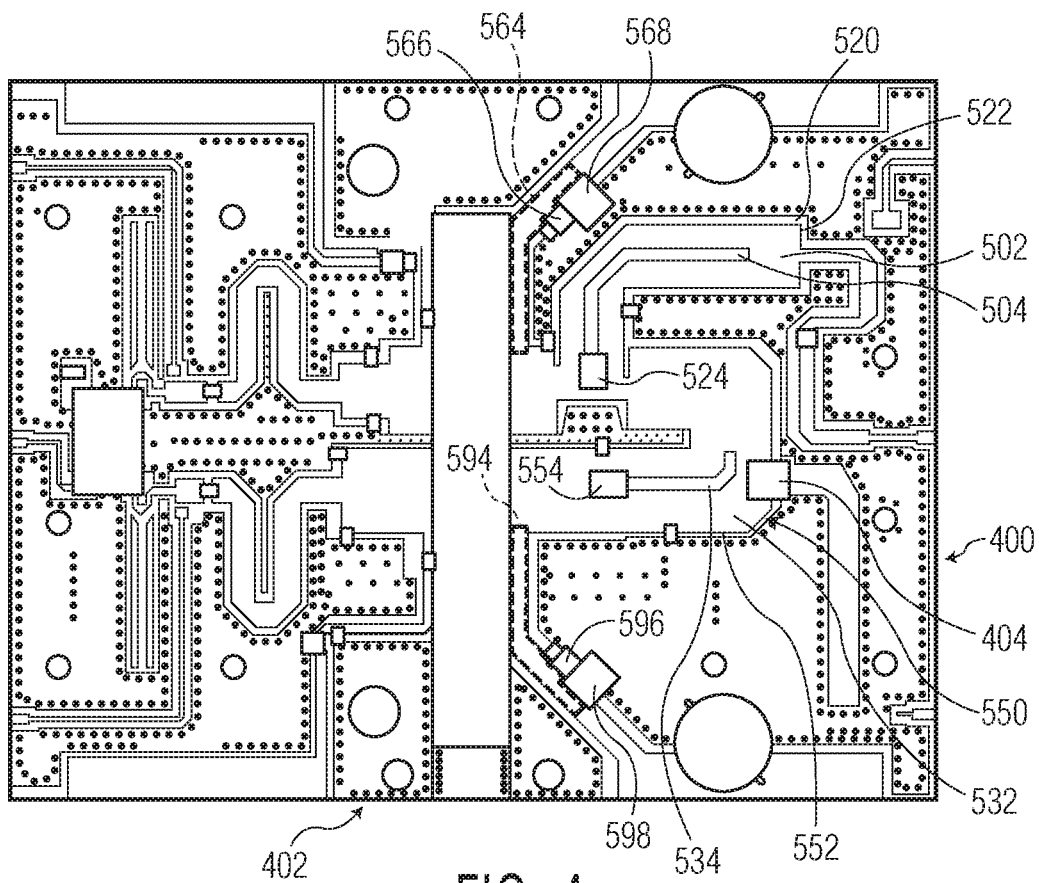
FIG. 4 is a top plan view of an example PCB having structures that form (at least in part) a circuit including a high power amplifier and two pairs of nested bias lines, such as that represented by FIG. 2.
Figure 5:
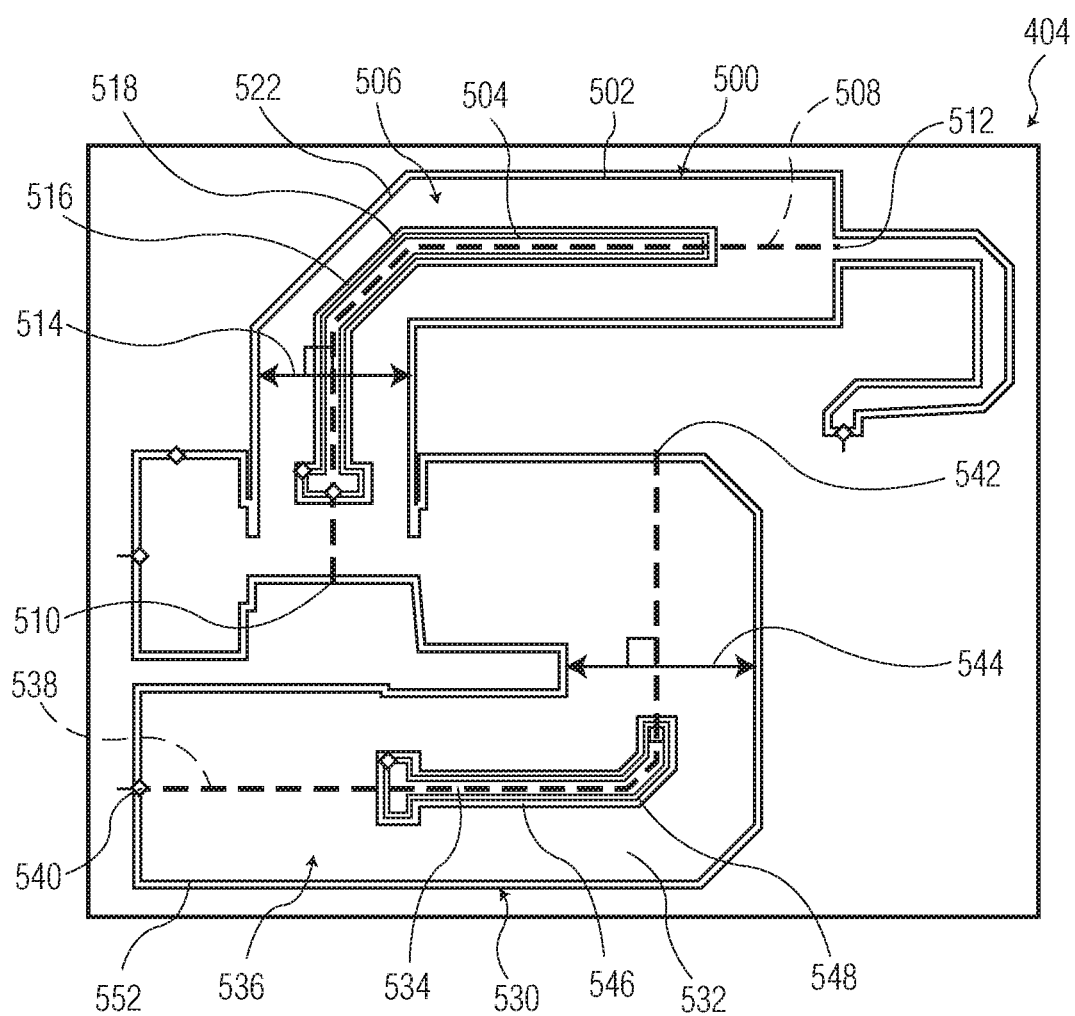
FIG. 5 is a further view of a portion of the top plan view of FIG. 4 that highlights those of the structures of the PCB that form the two pairs of nested bias lines.

Referring to FIG. 4, a top plan view of a first PCB system 400 having nested bias lines is provided. The first PCB system 400 particularly includes components 402 that operate as a Doherty power amplifier in combination with an arrangement 404 that includes a pair of nested bias lines, and that therefore is an embodiment that is represented by (or encompassed by or corresponds to) the circuit 200 of FIG. 2. Further, FIG. 5 is provided that shows in more detail a top plan view of the arrangement 404 having the pair of nested bias lines. It should be appreciated that, although only a top plan view of the first PCB system 400 is shown in FIG. 4, all of the components 402 and the arrangement 404 are formed as part of a PCB that also includes multiple layers including a conductive (e.g., ground plane) layer, an additional layer at which conductive traces are formed, and a dielectric substrate layer between those other two layers, that can be identical or substantially similar to the PCB described with respect to FIG. 3. Because FIG. 4 shows a top plan view, the features shown in FIG. 4 particularly include conductive traces formed on the aforementioned additional layer and portions of the dielectric substrate layer that are revealed at locations at which no conductive traces of the additional layer are present.

As shown, a first portion 500 of the arrangement 404 includes a first microstrip transmission line or trace 502 and a second microstrip transmission line or trace 504. The first portion 500 can be employed as part of the carrier amplifier portion of the Doherty power amplifier circuitry. The second trace 504 is positioned within an inner orifice or region 506 of the first trace 502. Further as shown, the first trace 502 in the present example embodiment extends along a central path (shown by a dashed line) 508 that is generally J-shaped (or bent or dog-leg-shaped). A length of the first trace 502 as measured between a first point 510 and a second point 512 along the central path 508 is generally greater in extent than the width of the first trace as measured perpendicular to the central path 508 along its length—a first example 514 of the width of the first trace is shown in FIG. 5, it being understood that the width of the first trace 502 can and in this example embodiment does vary along the length of the first trace. The first and second points 510, 512 can be, but need not be, representative of points or locations (or ports or terminals) at which electrical coupling of the first trace 502 to other circuit components can occur.

Additionally as shown, the second trace 504 generally extends along the central path 508 along a majority of the length of the first trace 502 between the first and second points 510, 512. However, the second trace 504 does not extend the entire length of the first trace 502 and particularly does not extend up to either of the first point 510 or the second point 512. Further, the width of the second trace 504 only extends a fraction of the width of the first trace 502 along the entire length of the second trace, such that the second trace is entirely surrounded by the first trace. Although the second trace 504 is positioned within the first trace 502 and is formed from the same layer of conductive material from which the first trace is formed, it should be appreciated that the second trace is defined by a gap 516 in conductive material that extends around a perimeter 518 of the second trace 504 and that electrically isolates the conductive material of the second trace 504 from the conductive material forming the first trace 502. The gap 516 constitutes a portion of the inner orifice 506 mentioned above.

Also it should be appreciated that an additional gap 520 in conductive material (see particularly FIG. 4) is provided that extends around a perimeter 522 of the first trace 502 so as to electrically isolate the conductive material for the first trace 502 from other conductive material surrounding the first trace. Although not shown in detail, the second trace 504 can be coupled to one or more other components by way of vias extending through the PCB.

In addition to the first portion 500 of the arrangement 404, FIG. 4 additionally shows a second portion 530 of the arrangement 404 that includes a third trace 532 and a fourth trace 534. The second portion 530 can be employed as part of the peaking amplifier portion of the Doherty power amplifier circuitry. The fourth trace 534 is positioned within an inner orifice or region 536 of the third trace 532. Further as shown in FIG. 5, the third trace 532 in the present example embodiment extends along a central path (shown by a dashed line) 538 that is generally J-shaped. A length of the third trace 532 as measured between a first point 540 and a second point 542 along the central path 538 is generally greater in extent than the width of the third trace as measured perpendicular to the central path 538 along its length—a first example 544 of the width of the third trace is shown in FIG. 5, it being understood that the width of the third trace 532 can and in this example embodiment does vary along the length of the third trace. The first and second points 540, 542 can be, but need not be, representative of points or locations (or ports or terminals) at which electrical coupling of the third trace 532 to other circuit components can occur.

Additionally as shown, the fourth trace 534 generally extends along the central path 538 along a portion (albeit, in this example, less than half) of the length of the third trace 532 between the first and second points 540, 542. However, the fourth trace 534 does not extend the entire length of the third trace 532 and particularly does not extend up to either of the first point 540 or the second point 542. Further, the width of the fourth trace 534 only extends a fraction of the width of the third trace 532 along the entire length of the fourth trace, such that the fourth trace is entirely surrounded by the third trace. Although the fourth trace 534 is positioned within the third trace 532 and is formed from the same layer of conductive material from which the first trace is formed, it should be appreciated that the fourth trace is defined by a gap 546 in conductive material that extends around a perimeter 548 of the fourth trace 534 and that electrically isolates the conductive material of the fourth trace 534 from the conductive material forming the third trace 532. The gap 546 constitutes a portion of the inner region 536.

Also it should be appreciated that an additional gap 550 (see particularly FIG. 4) is provided that extends around a perimeter 552 of the third trace 532 so as to electrically isolate the conductive material for the third trace 532 from other conductive material surrounding the third trace. Although not shown in detail, the fourth trace 534 can be coupled to one or more other components by way of vias extending through the PCB.

As is evident from FIGS. 4 and 5, in the present example, the perimeter 522 and perimeter 552 form an overall perimeter of the first trace 502 and third trace 532 which are adjacent to one another and electrically coupled with one another. By contrast, the second trace 504 and fourth trace 534 are electrically isolated from one another (in addition to being electrically isolated from the first and third traces 502, 532), at least in terms of being not electrically coupled at the level of the additional (e.g., copper) layer shown in FIGS. 4 and 5.

In terms of signal propagation, the second trace 504 serves as a bias line that is nested (or positioned) within the first trace 502. More particularly, the signal path for signals communicated by way of the second trace 504, which typically are baseband signals, will follow the perimeter 518 of the second trace 504. Further, the main signal path for signals communicated by way of the first trace 502, which typically are RF signals (e.g., RF source signals), will follow the perimeter 522. That is, the signals of the first trace 502 (e.g., RF signals) propagate along the perimeter 522 and the signals of the second trace 504 (e.g., baseband signals) propagate along the perimeter 518. Further, it should be appreciated that the second trace 504 is designed to mimic a bias line electrical length, and the second trace is decoupled (isolated) from the main signals (e.g., the RF signals) of the first trace 502 so as to prevent leakage from RF signals. Correspondingly, the first trace 502 serving as the main path for carrying the main signals (again, e.g., the RF signals) will not see that second trace 504 or the signals (e.g., baseband signals) carried thereby, given its being isolated from the second trace.

Likewise, in terms of signal propagation, the fourth trace 534 serves as a bias line that is nested (or positioned) within the third trace 532. More particularly, the signal path for signals communicated by way of the fourth trace 534, which typically are baseband signals, will follow the perimeter 548 of the fourth trace 534. Further, the main signal path for signals communicated by way of the third trace 532, which typically are RF signals (e.g., RF source signals), will follow the perimeter 552. That is, the signals of the third trace 532 (e.g., RF signals) propagate along the perimeter 552 and the signals of the fourth trace 534 (e.g., baseband signals) propagate along the perimeter 548. Further, it should be appreciated that the fourth trace 534 is designed to mimic a bias line electrical length, and the fourth trace is decoupled (isolated) from the main signals (e.g., the RF signals) of the third trace 532 so as to prevent leakage from RF signals. Correspondingly, the third trace 532 serving as the peaking path for carrying the peaking signals (again, e.g., the RF signals) will not see that fourth trace 534 or the signals (e.g., baseband signals) carried thereby, given its being isolated from the second trace.

It should be appreciated that the present disclosure is intended to encompass many different embodiments of bias lines in which one bias line (or multiple bias lines) are nested within another bias line, as well as intended to encompass numerous different circuits or systems that employ such arrangements. Nevertheless, as already mentioned, the first PCB system 400 of FIG. 4 (and FIG. 5) is intended to be an embodiment that is represented by (or encompassed by or corresponds to) the circuit 200 of FIG. 2. In this regard, it should be appreciated that the second trace 504 and the fourth trace 534 and associated structures can serve as examples of bias lines as are present in the circuit 200 of FIG. 2. For example, the second trace 504 can be or correspond to the first transmission line 230 of the first bias line 206, and the fourth trace 534 can be or correspond to the second transmission line 231 of the second bias line 208. Further in this respect a rectangle 524 shown in FIG. 4 at one end of the second trace 504 is a capacitor that can be considered to constitute (or represent) the parallel combination of the capacitors 234 and 238 of the first bias line 206, and a rectangle 554 shown in FIG. 4 at one end of the fourth trace is a capacitor that can be considered to constitute (or represent) the parallel combination of the capacitors 235 and 239 of the second bias line 208. Accordingly, the second trace 504 and rectangle 524 can be understood as forming (or representing) the first bias line 206, and the fourth trace 534 and rectangle 554 can be understood as forming (or representing) the second bias line 208.

In the example embodiment of FIG. 4, the nested bias lines that are provided are those formed by way of the second trace 504 and the fourth trace 534, in combination respectively with the combinations of capacitors represented by the rectangle 524 and the rectangle 554, respectively. To the extent that those respective nested bias lines are intended to correspond to the bias lines 206 and 208, respectively, it should be appreciated that both of the second trace 504 and the fourth trace 534, even though not electrically coupled directly with one another at the level of the traces within the PCB, nevertheless are electrically short-circuited with one another and are at least indirectly electrically coupled to the transistor 218 in a manner consistent with that shown in FIG. 2 (e.g., both of the traces 504, 534 are electrically short-circuited to a node corresponding to the output port 228).

It should be noted that, in the present embodiment shown in FIG. 4, it is the ends of the traces 504, 534 at which the combinations of capacitors represented by the rectangles 524, 554 are located that are electrically short-circuited to a node corresponding to the output port 228. Notwithstanding this aspect, it should be appreciated that such an arrangement is not inconsistent with FIG. 2, even though FIG. 2 shows the transmission line 230 as being coupled between the output port 228 and the capacitors 234, 238, and even though FIG. 2 shows the transmission line 231 as being coupled between the output port 228 and the capacitors 235, 239. Rather, it should be understood that, at RF frequencies of operation, coupling of the capacitors 234, 238 and 235, 239 at different points along the lengths of the respective traces 504, 534 does not affect operation of the overall circuit. That is, the operation of the circuit of FIG. 4 would be unchanged or substantially unchanged regardless of whether the rectangle 524 was moved to any location between the presently-indicated location and the opposite end of the trace 504, and regardless of whether the rectangle 554 was moved to any location between the presently-indicated location and the opposite end of the trace 534.

Although the nested bias lines of FIG. 4 that correspond to the first and second bias lines 206, 208 of FIG. 2 are those formed by way of the second trace 504 and the fourth trace 534, this is not to say that the embodiment of FIG. 4 lacks structures corresponding to the third bias line 210 and fourth bias line 212 of FIG. 2. To the contrary, the first PCB system 400 of FIG. 4 also includes a first non-nested bias line arrangement that includes a trace 564, a first capacitor pad 566, and a second capacitor pad 568, which can be considered to constitute the third bias line 210. More particularly, the trace 564 can be considered to constitute the third transmission line 232, the first capacitor pad 566 can be considered to constitute (or represent) the first capacitor 236, and the second capacitor pad 568 can be considered to constitute (or represent) the second capacitor 240. Also, the first PCB system 400 of FIG. 4 further includes a second non-nested bias line arrangement that also includes a trace 594, a first capacitor pad 596, and a second capacitor pad 598, which can be considered to constitute the fourth bias line 212. More particularly, the trace 594 can be considered to constitute the fourth transmission line 233, the first capacitor pad 596 can be considered to constitute (or represent) the first capacitor 237, and the second capacitor pad 598 can be considered to constitute (or represent) the second capacitor 241. Thus, in the example embodiment of FIG. 4 (and FIG. 5), a combination of nested bias lines and non-nested bias lines can be employed to achieve a circuit having four bias lines such as that of FIG. 2. Further, it should be appreciated that the other traces or structures of the first PCB system 400 of FIG. 4 (and FIG. 5) can additionally serve other purposes. For example, as already noted above, the first trace 502 and the third trace 532 can be employed to propagate RF (as opposed to baseband) signals. It should be appreciated that, to achieve this purpose, the first and third traces 502, 532 can be independently coupled or jointly coupled to one or more other power sources (e.g., other transistors other than the transistor 218).

Figure 6:
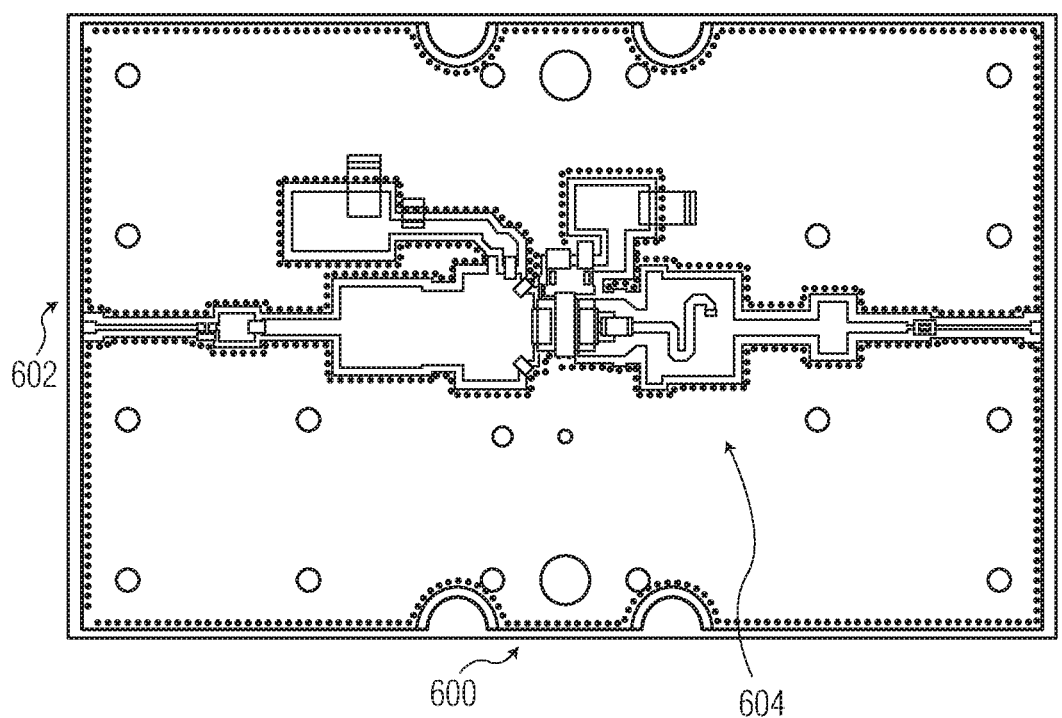
FIG. 6 is a top plan view of an additional example PCB having structures that form (at least in part) a circuit including a pair of nested bias lines, in accordance with another embodiment encompassed herein.
Figure 7:
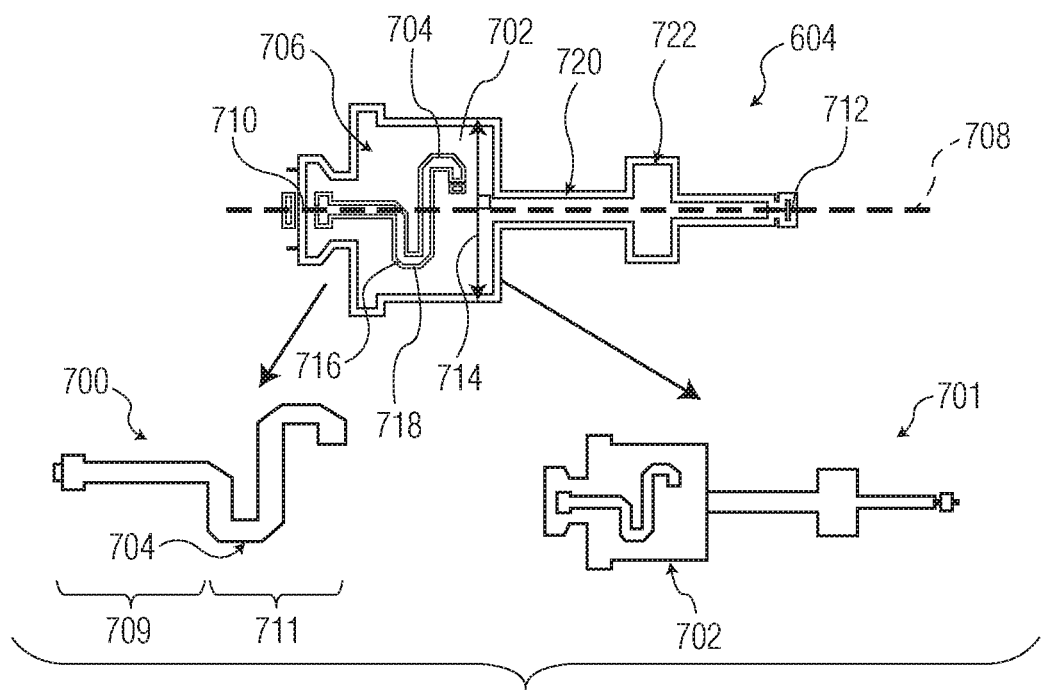
FIG. 7 is a further view of a portion of the top plan view of FIG. 6 that highlights those of the structures of the PCB that form the pair of nested bias lines, included views of exploded portions of the pair of nested bias lines.

Turning to FIG. 6, a top plan view of a second PCB system 600 having a nested bias line is provided. The second PCB system 600 particularly includes components 602 that operate as a class AB amplifier in combination with a nested bias line arrangement 604. Further, FIG. 7 is provided that shows in more detail a top plan view of the arrangement 604. As shown, the nested bias line arrangement 604 particularly includes a first trace 702 and a second trace 704. The second trace 704 is positioned within an inner orifice or region 706 of the first trace 702. To further highlight the features of the first trace 702 and second trace 704, FIG. 7 additionally includes a first exploded view 700 showing the second trace 704 without the first trace 702 being present, and also a second exploded view 701 showing the first trace 702 without the second trace 704 being present.

Further as shown, the first trace 702 in the present example embodiment extends along a central path (shown by a dashed line) 708 that is generally straight. A length of the first trace 702 as measured between a first point 710 and a second point 712 along the central path 708 is generally greater in extent than the width of the first trace as measured perpendicular to the central path 708 along its length—a first example 714 of the width of the first trace is shown in FIG. 7, it being understood that the width of the first trace 702 can and in this example embodiment does vary along the length of the first trace.

Additionally as shown, the second trace 704 generally extends along the central path 708 about one-third to one-half of the length of the first trace 702 between the first and second points 710, 712, and particularly extends within a portion of the first trace 702 that has the first example 714 width of the first trace. The second trace 704 does not extend the entire length of the first trace 702 and particularly does not extend up to either of the first point 710 or the second point 712. Although a first portion 709 (about half of the length) of the second trace 704 is straight and substantially parallel to (and overlays) the central path 708, a second portion 711 (about half of the length, as measured along the central path 708) of the second trace is undulating or S-shaped. Further, the width of the second trace 704 only extends a fraction of the width of the first trace 702 along the entire length of the second trace, such that the second trace is entirely surrounded by the first trace.

Although the second trace 704 is positioned within the first trace 702 and is formed from the same layer of conductive material from which the first trace is formed, it should be appreciated that the second trace is defined by a gap 716 that extends around a perimeter 718 of the second trace 704 and that electrically isolates the conductive material of the second trace 704 from the conductive material forming the first trace 702. The gap 716 constitutes a portion of the inner region 706. Also it should be appreciated that an additional gap 720 in conductive material (see particularly FIG. 6) is provided that extends around a perimeter 722 of the first trace 702 so as to electrically isolate the conductive material for the first trace 702 from other conductive material surrounding the first trace.

In terms of signal propagation, the second trace 704 serves as a bias line that is nested (or positioned) within the first trace 702. More particularly, the signal path for signals communicated by way of the second trace 704, which typically are baseband signals, will follow the perimeter 718 of the second trace 704. Further, the main signal path for signals communicated by way of the first trace 702, which typically are RF signals (e.g., RF source signals), will follow the perimeter 722. That is, the signals of the first trace 702 (e.g., baseband signals) propagate along the perimeter 718 and the signals of the second trace 704 (e.g., RF signals) propagate along the perimeter 722. Further, it should be appreciated that the second trace 704 is designed to mimic a bias line electrical length, and the second trace is decoupled (isolated) from the main signals (e.g., the RF signals) of the first trace 702 so as to prevent leakage from RF signals. The portion of the second trace 704 that is S-shaped or undulating also provides a minimal impedance path to ground (at the baseband, signal frequency or frequencies). Correspondingly, the first trace 702 serving as the main path for carrying the main signals (again, e.g., the RF signals) will not see that second trace 704 or the signals (e.g., baseband signals) carried thereby, given its being isolated from the second trace. The main (RF) signal path provided by the first trace 702 is isolated from the inner baseband signal path provided by the second trace 704 and therefore will not impact the shorter wavelength impedance.

Although the second PCB system 600 of FIG. 6 (and FIG. 7) is not a Doherty power amplifier system as described above in regard to FIG. 4 (and FIG. 5), it should be appreciated that the baseband signals communicated to, and propagated by, the second trace 704, can be supplied directly or indirectly by a power source such as a transistor, including for example the transistor 218 of FIG. 2. Also, it should be appreciated that the RF signals communicated to, and propagated by, the first trace 702, can also be supplied directly or indirectly by another power source (which also can be a transistor). Further, it should be appreciated that one or more capacitors can be linked to the second trace 704 (e.g., in the manner represented by the rectangles 524, 554 of FIG. 4) to allow the second trace to operate as a bias line consistent with any of the bias lines 206, 208, 210, and 212 of FIG. 2.

In regard to the nested bias line arrangements of the PCB systems described above in relation to each of FIGS. 4, 5, 6, and 7, it should be appreciated that two signals (e.g., two RF signals, or two RF and baseband signals) can be made to coexist in the same space by embedding one signal path into a second signal path. Such operation can particularly be achieved, in at least some embodiments, if three design rules are followed in establishing the nested bias line arrangements. First, it should be appreciated that two transmission lines or traces that are nested, one within the other (e.g., any of the second traces 504, 534, 704, respectively, within any of the first traces 502, 532, 702, respectively), will have minimum disturbance (coupling) therebetween if both of the transmission lines/traces are properly isolated from one other. One manner of ensuring proper isolation between a pair of nested transmission lines/traces is to design the two transmission lines/traces to operate at significantly different wavelengths, for example, where a first wavelength of operation of the first transmission line/trace ($\lambda 1$) is much greater than a second wavelength of operation of the second transmission line/trace ($\lambda 2$) (that is, so that $\lambda 1 \gg \lambda 2$).

A second design rule that should be followed in establishing the nested bias line arrangements is that the nested bias line arrangements should be designed to exhibit skin effect uniformity. As the frequency of operation (signal frequency) increases, the majority of the RF energy of signals propagated along a transmission line/trace tends to propagate on or along the edges or boundaries (e.g., the outer perimeters) of the transmission line/trace. To keep RF propagation undisturbed, the boundaries of the transmission line/trace, at which the majority of the RF signal energy is present, should remain consistent and untouched, trimmed or modified. The exact characteristics of the boundaries can vary depending upon the embodiment but, at least in some embodiments, desired boundaries can be achieved by forming a protective ring around the inner (nested) transmission/line trace that separates that transmission line/trace from the outer transmission line/trace. Such a protective ring is present in each of the embodiments described above in regard to FIGS. 4, 5, 6, and 7, in the form of any of the gap 516, the gap 546, and the gap 716. In at least some such embodiments, the protective ring (or gap) can have a width of (or be designed to have a width that provides or is suitable for) 50 ohm (e.g., a width of 50 ohm at its minimum).

A third design rule that should be followed in establishing the nested bias line arrangements results from the fact that the loss of conductive material from the outer transmission line/trace, due to the nesting of the inner transmission line/trace therewithin, will affect the performance of the outer transmission line/trace. That is, nesting an inner trace signal into an outer trace signal path will require cutting into the outer trace signal path. Further with respect to the embodiments of FIGS. 4, 5, 6, and 7 for example, the nesting of the traces 504, 534, and 704, respectively, within the traces 502, 532, and 702, respectively, will affect the performance of the traces 502, 532, and 702, respectively. Electrically, a transmission line (or trace) will grow longer, in terms of phase, if not designed properly. Therefore, in designing nested bias line arrangements, such effects upon the performance of the outer transmission line/trace should be taken into account.

In view of these considerations, and to achieved desired operation, the loss of conductive material and its effects can be calculated by the total combined interaction between the transmission line equations per unit segment based upon equation (9):

$$Z_n = \sum_{m=1}^{m} Z_m \frac{Z_{n-1} + jZ_m \tan \beta \ell_m}{Z_{n-1} + jZ_{n-1} \tan \beta \ell_m} \quad (9)$$

Relatedly, phase control can be determined based upon the following relationship expressed by equation (10):

$$\beta \ell = \left(\frac{\omega}{v_p}\right)\left(\frac{\lambda_o}{4}\right) \Rightarrow \quad (10)$$

Also, it should be appreciated that the ratio (or approximately the ratio) of $Z_m$ to $Z_n$ ($Z_m/Z_n$) controls impedance dispersion.

Figure 8:
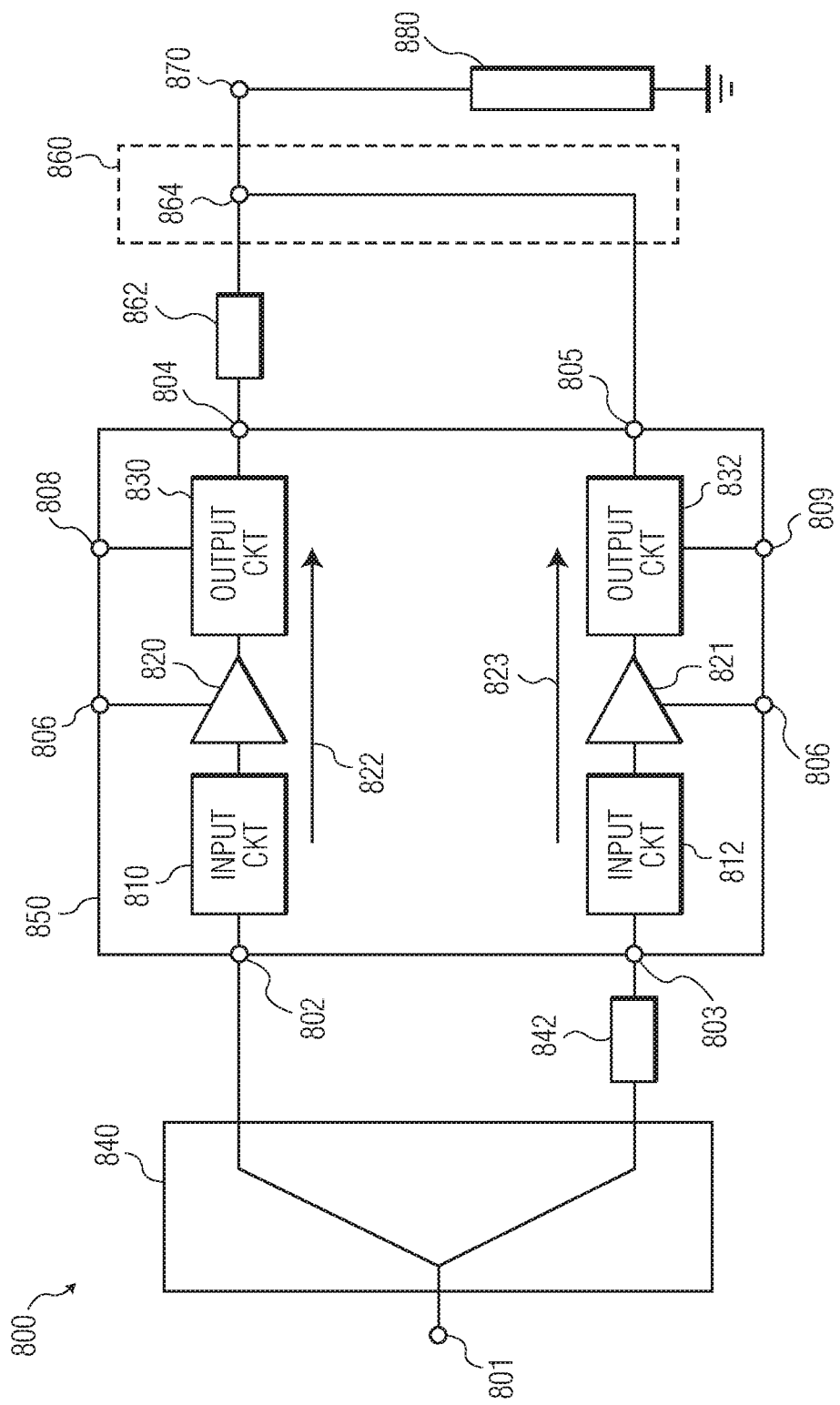
FIG. 8 is a block diagram of a Doherty power amplifier, in accordance with an embodiment.

Turning to FIG. 8, a block diagram of a Doherty power amplifier (or amplifier system) 800, in accordance with an embodiment encompassed herein, is shown. The Doherty power amplifier 800 includes an input node 801, an output node 870, a power divider 840, an RF amplifier device 850 (e.g., a packaged device), and a power combiner 860, according to the present embodiment. The power divider 840 is coupled between the input node 801 and input terminals 802, 803 to the RF amplifier device 850, and the power combiner 860 is coupled between output terminals 804, 805 of the RF amplifier device 850 and the output node 870. An input signal received at the input node 801 is amplified by the Doherty power amplifier (or amplifier system) 800 and provided to a load 880 (e.g., an antenna) via the output node 870.

More specifically, during operation, the power divider 840 is configured to divide the power of the input signal received at the input node 801 into multiple portions (e.g., equal portions) of the input signal, where respective portions of the input signal are provided to the input terminals 802, 803. For example, a first output of the power divider 840 may be coupled to the input terminal 802 corresponding to a first (or main) amplifier path 822, and a second output of the power divider 840 may be coupled to the input terminal 803 corresponding to a second (or peaking) amplifier path 823. The power divider 840 may divide the input power equally among the amplifier paths 822, 823, such that roughly half of the input signal power is provided to each amplifier path 822, 823. Alternatively, the power divider 840 may divide the power unequally.

The Doherty power amplifier (or amplifier system) 800 includes a first phase inversion element 842 between the second output of the power divider 840 and the input terminal 803 corresponding to the peaking amplifier path 823. For example, the first phase inversion element 842 may be implemented as a quarter wave transmission transformer (e.g., a 90° phase length transmission line) or a lumped element implementation of a 90° phase transformer. The Doherty power amplifier (or amplifier system) 800 also includes a second phase inversion element 862 between the output terminal 804 corresponding to the main amplifier path 822 and a summing node 864 of the power combiner 860. The output terminal 805 for the peaking amplifier path 823 also is coupled to the summing node 864. As with the first phase inversion element 842, the second phase inversion element 862 may be implemented as a quarter wave transmission transformer (e.g., a 90° phase length transmission line) or a lumped element implementation of a 90° phase transformer. The combination of phase inversion elements 842, 862 ensures that the currents ultimately provided to the summing node 864 by the respective amplifier paths 822, 823 are provided substantially in-phase with each other. Accordingly, the current provided by the summing node 864 to the output node 870 (and to the load 880) represents the in-phase summation of the currents provided by the amplifier paths 822, 823.

In an alternate embodiment, positive and negative phase shifts may be applied along both of the amplifier paths 822, 823 at the inputs of the device 850 to achieve approximately 90° of phase difference between the signals processed through the device 850 along the main and peaking amplifier paths 822, 823. Similarly, positive and negative phase shifts may be applied along both of the amplifier paths 822, 823 at the outputs of the device 850 to ensure that the signals are combined in phase at the summing node 864. In another alternate embodiment, the amplifier system may be configured in an "inverted Doherty" configuration. In such a configuration, the input side phase inversion element is included at the input to the main amplifier path (rather than at the input to the peaking amplifier path), and the output side phase inversion element is included at the output of the peaking amplifier path (rather than at the output of the main amplifier path).

As already noted, the RF amplifier device 850 includes multiple amplifier paths, namely, in this example, the amplifier paths 822, 823. Each of the amplifier paths 822, 823 includes an input impedance matching circuit (INPUT CKT) 810, 812, respectively, one or more amplifier stages 820, 821, respectively, and an output impedance matching circuit (OUTPUT CKT) 830, 832, respectively, coupled in series between the input terminals 802, 803, respectively, and the output terminals 804, 805, respectively, of the device 850. Each of the amplifier stages 820, 821 may be coupled to a voltage reference plane (e.g., ground) through terminals 806. In addition, it should be appreciated that the circuit 200 of FIG. 2, including the high power amplifier 202 (including the transistor 218) and also the set of bias lines 204 (or portions of the circuit 200), can for example be employed in or as one or both of (or portions of one or both of) the one or more amplifier stages 820, 821, or the combination of both of the amplifier stages. Correspondingly, the circuitry represented in FIG. 4 and FIG. 5 (or portions thereof), or the circuitry represented in FIG. 6 and FIG. 7 (or portions thereof), can for example be considered as being employed in or as one or both of (or portions of one or both of) the amplifier stages 820, 821.

According to various embodiments, the Doherty power amplifier 800 may be a symmetrical Doherty power amplifier or an asymmetrical Doherty power amplifier. Accordingly, the amplifier stages 820, 821 may be symmetrical (i.e., substantially the same size) or asymmetrical (i.e., of different sizes). In the Doherty configuration, the amplifier stage 820 may be configured and operated as a main amplifier, and the amplifier stage 821 may be configured as and operated as a peaking amplifier. The main amplifier stage 820 is configured as a Class AB amplifier, meaning that the transistor arrangement of the main amplifier stage 820 is biased to provide a conduction angle between 80 and 360 degrees. Conversely, the peaking amplifier stage 821 is realized as a transistor arrangement configured as a Class C amplifier, meaning that the transistor arrangement of the peaking amplifier stage 821 is biased to provide a conduction angle less than 80 degrees. For example, bias voltages may be provided to the main and peaking amplifier stages 820, 821 through terminals 808, 809, each of which may be coupled to an appropriate bias voltage.

The main and peaking amplifier stages 820, 821 also may be coupled to other circuitry through terminals 808, 809. For example, the amplifier stages 820, 821 may be coupled to envelope frequency termination circuitry or other circuitry by way of the terminals 808, 809. Additionally, although in some embodiments (as discussed above) a circuit including one or more bias lines, such as the circuit 200 with the bias lines 204 of FIG. 2, is provided as each of or either of the amplifier stages 820, 821, in other embodiments bias lines are not part of the amplifier stages but rather are coupled to one or more of the terminals 808, 809. That is, in such other embodiments, the bias lines would be external relative to the device 850 as shown in FIG. 8. Also, in further alternate embodiments, one or more of the bias lines can be provided elsewhere in the Doherty power amplifier arrangement 800 including, for example, as part of the phase inversion element 862 or as part of (or otherwise associated with) the power combiner 860 or the summing node 864 thereof.

Each of the input impedance matching circuits 810, 812 is configured to provide a desired input impedance at its respective input terminal 802, 803 at the fundamental frequency (or carrier frequency) of the Doherty power amplifier (or amplifier system) 800. Further, each of the output impedance matching circuits 830, 832 is configured to provide a desired output impedance at its respective output terminal 804, 805 at the fundamental frequency of the Doherty power amplifier (or amplifier system) 800. In an exemplary embodiment, the Doherty power amplifier (or amplifier system) 800 is used to transmit RF signals, and the fundamental frequency (or carrier frequency) is the frequency of transmittance.

It should be understood that FIG. 8 is a simplified representation of a Doherty power amplifier (or amplifier system) 800 for purposes of explanation and ease of description, and that practical embodiments may include other devices and components to provide additional functions and features, and/or the amplifier system 800 may be part of a much larger electrical system, as will be understood. For example, embodiments of devices discussed herein may be incorporated into amplifiers having a single amplification path or more than two amplification paths, as well as amplifiers having configurations other than Doherty configurations.

In view of the above discussion, it will be appreciated that embodiments of circuits or systems such as those described above or otherwise encompassed herein may provide any of a variety of advantages. Among other things, in at least some such embodiments, the baseband resonance may be increased in frequency even while the overall amount of printed circuit board (PCB) real estate that is employed is reduced, and even while a proper impedance transformation to a load (e.g., to a 50 ohm load) is maintained. Also, in at least some embodiments, a level of the inductance of an envelope of the baseband frequency through which the current flows to support operation of the transistor of the power amplifier may be reduced even while the transistor is still matched. Further, in at least some embodiments, baseband resonance may be greatly increased without the need of using internal HiC (high value capacitor) baseband terminations. Alternatively, in at least some embodiments, the nesting of low frequency baseband terminations into high frequency impedance matching transformers may be employed in conjunction with HiC baseband terminations for improved low frequency (e.g., video) decoupling. Additionally, in at least some embodiments encompassed herein, nested microstrip lines may be used as a point of harmonic tuning by adjusting a harmonic resonant capacitor along the nested microstrip trace between the matching transformer and the ground short with no additional PCB real estate.

Notwithstanding the description provided above, the present disclosure is intended to encompass numerous other embodiments and variations of the embodiments described or shown herein. For example, although the embodiments described above illustrate example arrangements in which a single trace is positioned within an internal orifice or region within a single additional trace, in other embodiments it may be possible for two or more traces to be positioned within an internal orifice (or within multiple internal orifices) formed within a single additional trace, or for multiple traces to be positioned within one another in a recursive manner. Such arrangements can include, for example, an arrangement in which a first trace is formed within a first internal orifice of a second trace, and in which the second trace is formed within a second internal orifice of a third trace.

Further for example, although the various traces shown in the embodiments described above are all coplanar within one another (at the same layer level of a PCB, coplanar to another conductive layer that can be the ground plane), in alternate embodiments it is possible that different traces or pairs or groups of nested traces will be arranged in different manners that are in multiple different planes. For example, in one arrangement, a first trace would be positioned within a first internal orifice within a second trace, where both the first and second traces are positioned along a first plane, and additionally a third trace would be positioned within a second internal orifice within a fourth trace, where both the third and fourth traces are positioned along a second plane that is perpendicular to the first plane or otherwise not aligned with the first plane. Thus, in some such embodiments, the nested traces can take on a three-dimensional (or multi-planar) configurations rather than the essentially-two-dimensional (or single-planar) configurations of traces described above in regard to FIGS. 4, 5, 6, and 7.

Additionally, embodiments such as those described above or otherwise encompassed herein can be implemented in numerous applications. For example, embodiments such as those described above or otherwise encompassed herein can be implemented as or in conjunction with RF power products and broadband applications. In at least some such embodiments, the implementation of nested bias line arrangements enables efficient footprint space utilization that allows for implementation of a variety of other components or parts. Also at least some embodiments such as those described above or otherwise encompassed herein may be employed in air cavity or over over-molded packages, and/or may be applicable to both single-stage and multi-stage products such as integrated circuit modules. Further, at least some embodiments such as those described above or otherwise encompassed herein may be incorporated into, or utilize, Silicon, GaAS (gallium arsenide) or GaN-based transistors. Additionally, the present disclosure is also intended to encompass methods of operation and/or assembly of any of the systems and circuits described above or encompassed herein.

In view of the foregoing, numerous embodiments are intended to be encompassed herein. In at least some such embodiments, for example, a nested microstrip system includes a printed circuit board (PCB) having a first layer level, a second layer level, and a dielectric substrate positioned between the first and second layer levels, where a first conductive layer is positioned at the first layer level and a plurality of conductive traces are positioned at the second layer level, and where the plurality of conductive traces includes a first conductive trace and a second conductive trace. Additionally, the first conductive trace is configured to extend between a first location and a second location along a first path, one or more first electromagnetic signals having one or more first frequencies can be propagated along at least a first part of the first conductive trace, and the first conductive trace is configured to include a first interior orifice surrounded substantially by outer portions of the first conductive trace. Further, the second conductive trace is positioned within the first interior orifice and is configured to extend substantially along the first path at least a part of a first distance between the first and second locations, a first non-conductive gap portion of the first interior orifice exists between the second conductive trace and the first conductive trace so that the second conductive trace is electrically isolated from the first conductive trace across the gap portion, and one or more second electromagnetic signals can be propagated along at least a second part of the second conductive trace.

Additionally, in at least some other embodiments encompassed herein, a nested microstrip power amplifier system includes a printed circuit board (PCB) having a first layer level, a second layer level, and a dielectric substrate positioned between the first and second layer levels, where a first conductive layer is positioned at the first layer level and a plurality of conductive traces are positioned at the second layer level. Additionally, the nested microstrip power amplifier system also includes a power amplifier circuit formed at least partly on the PCB and including a transistor that includes an output terminal, and a nested microstrip transmission line arrangement formed at least partly on the PCB and including the plurality of conductive traces. Further in such embodiment, the plurality of conductive traces includes a first conductive trace and a second conductive trace, and at least the second conductive trace is electrically coupled to the output terminal of the transistor. Also, the first conductive trace is configured to extend along a first central path between a first location and a second location, and the second conductive trace is configured to extend also along the first central path within a first interior orifice formed within the first conductive trace, and a non-conductive gap portion of the interior orifice serves to electrically isolate the second conductive trace from the first conductive trace. Additionally, the first conductive trace is configured to communicate one or more RF electromagnetic signals, and the second conductive trace is configured to communicate one or more baseband electromagnetic signals.

Further, in at least some additional embodiments encompassed herein, a nested microstrip method includes providing a printed circuit board (PCB) having a first layer level, a second layer level, and a dielectric substrate positioned between the first and second layer levels, where a first conductive layer is positioned at the first layer level and a plurality of conductive traces are positioned at the second layer level, where the plurality of conductive traces includes a first conductive trace and a second conductive trace, where the first conductive trace is configured to include a first interior orifice surrounded substantially by outer portions of the first conductive trace, where the second conductive trace is positioned within the first interior orifice, and where a first non-conductive gap portion of the first interior orifice exists between the second conductive trace and the first conductive trace so that the second conductive trace is electrically isolated from the first conductive trace across the gap portion. Additionally, the method includes propagating one or more first electromagnetic signals having one or more first frequencies along the first conductive trace, and propagating one or more second electromagnetic signals having one or more second frequencies along the second conductive trace.

While the principles of the invention have been described above in connection with specific apparatus, it is to be clearly understood that this description is made only by way of example and not as a limitation on the scope of the invention. It is specifically intended that the present invention not be limited to the embodiments and illustrations contained herein, but include modified forms of those embodiments including portions of the embodiments and combinations of elements of different embodiments as come within the scope of the following claims.

What is claimed is:

1. A nested microstrip system comprising:
a printed circuit board (PCB) having a first layer level, a second layer level, and a dielectric substrate positioned between the first and second layer levels, wherein a first conductive layer is positioned at the first layer level and a plurality of conductive traces are positioned at the second layer level;
wherein the plurality of conductive traces includes a first conductive trace and a second conductive trace;
wherein the first conductive trace is configured to extend between a first location and a second location along a first path, and wherein one or more first electromagnetic signals having one or more first frequencies can be propagated along at least a first part of the first conductive trace;
wherein the first conductive trace is configured to include a first interior orifice surrounded substantially by outer portions of the first conductive trace;
wherein the second conductive trace is positioned within the first interior orifice and is configured to extend substantially along the first path at least a part of a first distance between the first and second locations;
wherein a first non-conductive gap portion of the first interior orifice exists between the second conductive trace and the first conductive trace so that the second conductive trace is electrically isolated from the first conductive trace across the first non-conductive gap portion; and
wherein one or more second electromagnetic signals can be propagated along at least a second part of the second conductive trace;
wherein the one or more second electromagnetic signals have one or more second frequencies that differ from the one or more first frequencies; and
wherein the one or more first electromagnetic signals are substantially or entirely electromagnetically decoupled from the one or more second electromagnetic signals.

2. The nested microstrip system of claim 1, wherein the first conductive trace includes a first outer perimeter along which the one or more first electromagnetic signals having one or more first frequencies can be propagated, and wherein the second conductive trace includes a second outer perimeter along which the one or more second electromagnetic signals can be propagated.

3. The nested microstrip system of claim 1, wherein the first path includes a bend such that the first conductive trace has a dog-leg shape.

4. The nested microstrip system of claim 1, wherein the plurality of conductive traces additionally includes a third conductive trace and a fourth conductive trace.

5. The nested microstrip system of claim 4, wherein the third conductive trace is configured to extend between a third location and a fourth location along an additional path and includes a third outer perimeter;
wherein the third conductive trace is configured to include an additional interior orifice surrounded substantially by additional outer portions of the third conductive trace;
wherein the fourth conductive trace is positioned within the additional interior orifice and is configured to extend at least an additional part of an additional distance between the third and fourth locations; and
wherein a second non-conductive gap portion of the additional interior orifice exists between the fourth conductive trace and the third conductive trace so that the fourth conductive trace is electrically isolated from the third conductive trace across the second non-conductive gap portion.

6. The nested microstrip system of claim 5, wherein the first path includes a first bend and the additional path includes an additional bend, and correspondingly the first conductive trace has a first dog-leg shape and the third conductive trace has a second dog-leg shape.

7. The nested microstrip system of claim 5, wherein one or more third electromagnetic signals are provided to, and propagated along, the third trace,
wherein one or more fourth electromagnetic signals are provided to, and propagated along, the fourth trace, and
wherein the one or more third electromagnetic signals are substantially or entirely electromagnetically decoupled from the one or more fourth electromagnetic signals due to the second non-conductive gap portion.

8. The nested microstrip system of claim 1, wherein the second trace includes an S-shaped portion.

9. The nested microstrip system of claim 1, wherein the one or more first electromagnetic signals are one or more RF electromagnetic signals,
wherein the one or more second electromagnetic signals are one or more baseband electromagnetic signals, and
wherein each of the one or more first frequencies of the one or more RF electromagnetic signals is substantially greater than each of the one or more second frequencies of the one or more baseband electromagnetic signals.

10. The nested microstrip system of claim 9, wherein each of the traces is configured to exhibit skin effect uniformity and the system is configured in a manner taking into account an absence of an additional portion of the first trace that is missing from the first trace due to the first interior orifice being present.

11. The nested microstrip system of claim 1, wherein the one or more second electromagnetic signals have one or more second frequencies that are significantly lower than the one or more first frequencies.

12. The nested microstrip system of claim 11, wherein the one or more first electromagnetic signals are radio frequency (RF) signals, and the one or more second electromagnetic signals are baseband signals.

13. A power amplifier system comprising:
a printed circuit board (PCB) having a first layer level, a second layer level, and a dielectric substrate positioned between the first and second layer levels, wherein a first conductive layer is positioned at the first layer level and a plurality of conductive traces are positioned at the second layer level;
a power amplifier circuit formed at least partly on the PCB and including a transistor that includes an output terminal;

a nested microstrip transmission line arrangement formed at least partly on the PCB and including the plurality of conductive traces, wherein the plurality of conductive traces includes a first conductive trace and a second conductive trace, and wherein at least the first conductive trace is electrically coupled to the output terminal of the transistor;

wherein the first conductive trace is configured to extend along a first central path between a first location and a second location, and the second conductive trace is configured to extend also along the first central path within a first interior orifice formed within the first conductive trace, and a non-conductive gap portion of the interior orifice serves to electrically isolate the second conductive trace from the first conductive trace; and wherein the first conductive trace is configured to communicate one or more radio frequency (RF) electromagnetic signals, and the second conductive trace is configured to communicate one or more baseband electromagnetic signals.

14. The power amplifier system of claim 13, wherein the interior orifice extends at least a majority of a distance between the first and second locations, and the one or more RF electromagnetic signals are substantially or entirely electromagnetically decoupled from the one or more baseband electromagnetic signals.

15. The power amplifier system of claim 13, wherein the power amplifier circuit is either a Doherty power amplifier circuit or a class AB amplifier circuit.

16. The power amplifier system of claim 15, wherein:
the power amplifier circuit is a Doherty power amplifier circuit, wherein the power amplifier circuit includes an additional transistor with an additional output terminal,
the first and second traces are comprised by a first nested arrangement included by the nested transmission line arrangement, and wherein the nested transmission line arrangement additionally includes a second nested arrangement including a third conductive trace and a fourth conductive trace of the plurality of traces, and
wherein at least the third conductive trace is electrically coupled to the additional output terminal of the additional transistor.

17. The power amplifier system of claim 16, wherein:
the third conductive trace is configured to extend along a second central path between a third location and a fourth location, and the fourth conductive trace is configured to extend also along the second central path within a second interior orifice formed within the third conductive trace, and an additional non-conductive gap portion of the second interior orifice serves to isolate the fourth conductive trace from the third conductive trace.

18. The power amplifier system of claim 16, wherein a total baseband resonance is enhanced substantially by a factor of two due to the propagating of the one or more RF electromagnetic signals along both of the first and third conductive traces rather than merely one of the first and third conductive traces.

19. The power amplifier system of claim 13, further comprising an adjustable harmonic resonant capacitor coupled to or along the second trace, which is a nested trace, so as to allow for harmonic tuning.

20. The nested microstrip system of claim 13, further comprising:
a capacitor coupled between the first conductive trace and the second conductive trace.

21. The nested microstrip system of claim 20, wherein the capacitor is coupled to a first end of the second conductive trace, and a second end of the second conductive trace is coupled to ground.

22. The nested microstrip system of claim 13, wherein the one or more RF electromagnetic signals are relatively high frequency signals, and the one or more baseband electromagnetic signals are relatively low frequency signals.

23. The nested microstrip system of claim 13, wherein the first conductive trace forms a portion of a high frequency impedance matching transformer, and the second conductive trace forms a portion of a low frequency baseband termination.

24. A method of forming an amplifier system, the method comprising:
providing a printed circuit board (PCB) having a first layer level, a second layer level, and a dielectric substrate positioned between the first and second layer levels, wherein a first conductive layer is positioned at the first layer level and a plurality of conductive traces are positioned at the second layer level,
wherein the plurality of conductive traces includes a first conductive trace and a second conductive trace, wherein the first conductive trace is configured to include a first interior orifice surrounded substantially by outer portions of the first conductive trace, wherein the second conductive trace is positioned within the first interior orifice, and wherein a first non-conductive gap portion of the first interior orifice exists between the second conductive trace and the first conductive trace so that the second conductive trace is electrically isolated from the first conductive trace across the first non-conductive gap portion; and
coupling an amplifier circuit to the PCB, wherein the amplifier circuit includes a transistor having an output terminal, wherein at least the first conductive trace is coupled to the output terminal,
wherein the first conductive trace is configured to propagate one or more first electromagnetic signals produced at the output terminal, wherein the one or more first electromagnetic signals have one or more first frequencies, and
wherein the second conductive trace is configured to propagate one or more second electromagnetic signals produced at the output terminal, wherein the one or more second electromagnetic signals have one or more second frequencies that are significantly lower than the one or more first frequencies.

25. The method of claim 24, further comprising:
coupling a capacitor between the first conductive trace and the second conductive trace, wherein the one or more second electromagnetic signals propagated along the second conductive trace are substantially or entirely electromagnetically decoupled from the one or more first electromagnetic signals, wherein the one or more first electromagnetic signals are one or more radio frequency (RF) electromagnetic signals, and wherein the one or more second electromagnetic signals are one or more baseband electromagnetic signals.

26. The method of claim 24, wherein the amplifier circuit is a Doherty power amplifier circuit, and
wherein coupling the amplifier circuit to the PCB comprises:
coupling the output terminal of the transistor to the first conductive trace; and coupling an additional output terminal of an additional transistor to a third conductive trace that is electrically coupled to the first conductive trace.

27. The method of claim 24, further comprising:
coupling a capacitor between the first conductive trace and the second conductive trace.

28. A nested microstrip system comprising:
a printed circuit board (PCB) having a first layer level, a second layer level, and a dielectric substrate positioned between the first and second layer levels, wherein a first conductive layer is positioned at the first layer level and a plurality of conductive traces are positioned at the second layer level;
wherein the plurality of conductive traces includes a first conductive trace and a second conductive trace;
wherein a capacitor is coupled between the first conductive trace and the second conductive trace;
wherein the first conductive trace is configured to extend between a first location and a second location along a first path, and wherein one or more first electromagnetic signals having one or more first frequencies can be propagated along at least a first part of the first conductive trace;
wherein the first conductive trace is configured to include a first interior orifice surrounded substantially by outer portions of the first conductive trace;
wherein the second conductive trace is positioned within the first interior orifice and is configured to extend substantially along the first path at least a part of a first distance between the first and second locations;
wherein a first non-conductive gap portion of the first interior orifice exists between the second conductive trace and the first conductive trace so that the second conductive trace is electrically isolated from the first conductive trace across the first non-conductive gap portion; and
wherein one or more second electromagnetic signals can be propagated along at least a second part of the second conductive trace.

29. The nested microstrip system of claim 28, wherein the capacitor is coupled to a first end of the second conductive trace, and a second end of the second conductive trace is coupled to ground.

30. A nested microstrip system comprising:
a printed circuit board (PCB) having a first layer level, a second layer level, and a dielectric substrate positioned between the first and second layer levels, wherein a first conductive layer is positioned at the first layer level and a plurality of conductive traces are positioned at the second layer level;
wherein the plurality of conductive traces includes a first conductive trace and a second conductive trace;
wherein the first conductive trace is configured to extend between a first location and a second location along a first path, and wherein one or more first electromagnetic signals having one or more first frequencies can be propagated along at least a first part of the first conductive trace;
wherein the first conductive trace is configured to include a first interior orifice surrounded substantially by outer portions of the first conductive trace;
wherein the second conductive trace is positioned within the first interior orifice and is configured to extend substantially along the first path at least a part of a first distance between the first and second locations;
wherein a first non-conductive gap portion of the first interior orifice exists between the second conductive trace and the first conductive trace so that the second conductive trace is electrically isolated from the first conductive trace across the first non-conductive gap portion; and
wherein one or more second electromagnetic signals can be propagated along at least a second part of the second conductive trace; and
wherein the first conductive trace forms a portion of a high frequency impedance matching transformer, and the second conductive trace forms a portion of a low frequency baseband termination.

31. A nested microstrip system comprising:
a printed circuit board (PCB) having a first layer level, a second layer level, and a dielectric substrate positioned between the first and second layer levels, wherein a first conductive layer is positioned at the first layer level and a plurality of conductive traces are positioned at the second layer level;
wherein the plurality of conductive traces includes a first conductive trace and a second conductive trace;
wherein the first conductive trace is configured to extend between a first location and a second location along a first path, and wherein one or more first electromagnetic signals having one or more first frequencies can be propagated along at least a first part of the first conductive trace;
wherein the first conductive trace is configured to include a first interior orifice surrounded substantially by outer portions of the first conductive trace;
wherein the second conductive trace is positioned within the first interior orifice and is configured to extend substantially along the first path at least a part of a first distance between the first and second locations;
wherein a first non-conductive gap portion of the first interior orifice exists between the second conductive trace and the first conductive trace so that the second conductive trace is electrically isolated from the first conductive trace across the first non-conductive gap portion;
wherein one or more second electromagnetic signals can be propagated along at least a second part of the second conductive trace; and
wherein the first path includes a bend such that the first conductive trace has a dog-leg shape, the second trace includes an S-shaped portion, or both the first conductive trace has a dog-leg shape and the second trace includes an S-shaped portion.

* * * * *